United States Patent [19]

Suzuki et al.

[11] Patent Number: 4,546,272
[45] Date of Patent: Oct. 8, 1985

[54] ECL CIRCUIT FOR FORCIBLY SETTING A HIGH LEVEL OUTPUT

[75] Inventors: Hirokazu Suzuki, Yamato; Masayuki Kokado, Kawasaki, both of Japan

[73] Assignee: Fujitsu Limited, Kawasaki, Japan

[21] Appl. No.: 498,727

[22] Filed: May 27, 1983

[30] Foreign Application Priority Data

May 31, 1982 [JP] Japan ................. 57-091375

[51] Int. Cl.$^4$ ................. H03K 19/086; H03K 19/092; H03K 19/003; H03K 17/06
[52] U.S. Cl. .................. 307/455; 307/443; 307/272 R
[58] Field of Search ............ 307/443, 475, 455, 467, 307/457, 200 A, 299 A, 272 R, 272 A, 273, 494, 605, 608, 355, 362; 330/252, 261

[56] References Cited

U.S. PATENT DOCUMENTS

| | | | |
|---|---|---|---|
| 3,321,639 | 5/1967 | Fowler et al. | 307/455 |
| 3,396,282 | 8/1968 | Sheng et al. | 307/455 X |
| 3,780,316 | 12/1973 | Wilhelm | 307/443 X |
| 3,885,169 | 5/1975 | Heightley | 307/272 A X |
| 4,105,942 | 8/1978 | Henry | 330/261 |
| 4,270,062 | 5/1981 | Hanna | 307/272 A |

FOREIGN PATENT DOCUMENTS

| | | | |
|---|---|---|---|
| 1441710 | 4/1965 | France | 307/272 R |
| 1099955 | 1/1968 | United Kingdom | 307/272 R |

OTHER PUBLICATIONS

Patent Abstracts of Japan, vol. 7, No. 84, Apr. 8, 1983.
Review of the Electrical Communication Laboratories, "Master Slice ECL LSI", Mukai et al., vol. 26, No. 9-10, Sep./Oct. 1978, pp. 1325-1337.

*Primary Examiner*—John S. Heyman
*Assistant Examiner*—David R. Bertelson
*Attorney, Agent, or Firm*—Staas & Halsey

[57] ABSTRACT

An ECL circuit includes a differential pair of transistors, a set transistor, and a set resistor connected between the emitters of the differential pair of transistors and the emitter of the set transistor. The output of the ECL circuit can be fixed securely to a "high" level only by applying a "high" level signal having the same level as the "high" level signal of the data input to the base of the set transistor.

5 Claims, 4 Drawing Figures

4,546,272

ECL CIRCUIT FOR FORCIBLY SETTING A HIGH LEVEL OUTPUT

CROSS-REFERENCE TO RELATED APPLICATION

This application is cross-referenced to related application U.S. Ser. No. 502,560, filed June 9, 1983.

BACKGROUND OF THE INVENTION (1) Field of the Invention

This invention relates to an emitter coupled logic (ECL) circuit, more particularly to an ECL circuit which receives a set input for forcibly setting its output to a "high" level (logic high level).

(2) Description of the Prior Art

Recently, ECL circuits have been coming into wide use for logic gate circuits due to their high operation speed. In one application, the ECL circuit is used with a set circuit. This type of ECL circuit usually comprises a differential pair of transistors for receiving complementary data inputs, a set or reset transistor, resistors, and a constant current source. In this ECL circuit, the set or reset input applied to the base of the set or reset transistor usually has a "low" level (logic low level). Thus, the output of the ECL circuit is determined by the state of the data inputs. When a "high" level signal is applied to the set input, the output of the ECL circuit is fixed to the "high" level regardless of the state of the data inputs. When a "high" level signal is applied to the reset input, the output is fixed to the "low" level.

In a prior art ECL circuit with a set circuit, the emitter of the set or reset transistor is directly connected to the emitters of the differential pair of transistors. Thus, to securely set or reset the output of the ECL circuit by the set or reset input, the threshold voltage of the set or reset transistor is made smaller than the threshold voltage of the differential pair of transistors. Therefore, even if the "H" level of the set or reset input is equal to the "H" level of the data inputs, the set or reset transistor is preferentially turned on when compared with the threshold voltage of the differential pair of transistors.

In current transistor manufacturing technology, however, the difference between the threshold levels of the differential transistors is at most several dozen mV. Accordingly, too much random variation of the signals applied to the gate of the set or reset transistor can disturb the operation of the set or reset transistor. Thus, in the above-mentioned prior art ECL circuit, it is necessary to make the "high" level signal applied to the set input higher than the "high" level signal applied to the data input. This, however, complicates the circuit construction.

SUMMARY OF THE INVENTION

The object of the present invention is to provide an ECL circuit with a set circuit wherein the emitter voltage of the set or reset transistor is made different from the emitter voltage of the differential pair of transistors, whereby the output of the ECL circuit can be set or reset securely by a set or reset input having the same level as the data inputs.

The above-mentioned object is accomplished by an ECL circuit comprising a differential pair of transistors having emitters commonly connected, having bases for receiving complementary signals and having collectors. The ECL circuit also comprises a constant current source, an impedance element connected between the commonly connected emitters of the differential pair of transistors and the constant current source, and a set transistor having an emitter connected to the constant current source, having a base for receiving a set signal and having a collector connected to the collector of one of the differential pair of transistors.

DESCRIPTION OF THE PREFERRED EMBODIMENTS

Before describing the preferred embodiments of the present invention, the foregoing prior art ECL circuit is described in accordance with the drawings.

Figure 1:
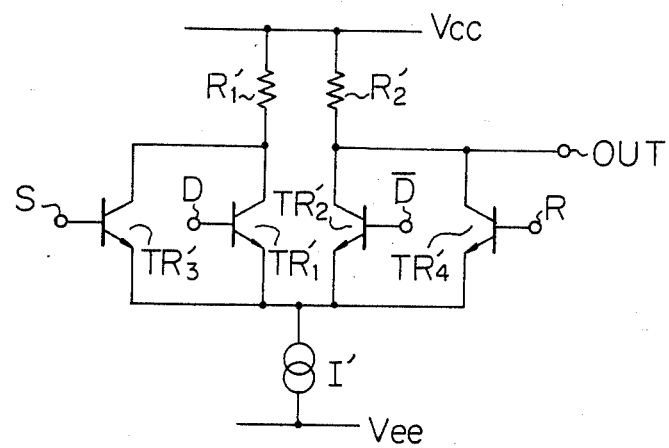
FIG. 1 is a circuit diagram of a prior art ECL circuit.

FIG. 1 is a circuit diagram of a prior art ECL circuit. The ECL circuit of FIG. 1 comprises a differential pair of transistors $TR_1'$ and $TR_2'$, load resistors $R_1'$ and $R_2'$, a set transistor $TR_3'$, a reset transistor $TR_4'$, and a constant current source $I'$. The emitters of the transistors $TR_1'$, $TR_2'$, $TR_3'$, and $TR_4'$ are commonly connected, and the constant current source $I'$ is connected between the commonly connected emitters and a lower voltage supply $V_{ee}$. The collector of the transistor $TR_1'$ is connected to a higher voltage supply $V_{cc}$ through the load resistor $R_1'$, and the collector of the transistor $TR_2'$ is connected to the higher voltage supply $V_{cc}$ through the load resistor $R_2'$. The collector of the set transistor $TR_3'$ is connected to the collector of the transistor $TR_1'$, and the collector of the reset transistor $TR_4'$ is connected to the collector of the transistor $TR_2'$.

Complementary data inputs D and $\overline{D}$ are applied to the bases of the transistors $TR_1'$ and $TR_2'$, respectively. A set input S and a reset input R are applied to the bases of the set and reset transistors $TR_3'$ and $TR_4'$, respectively. The collector of the transistor $TR_2$ is led out as the output OUT of the ECL circuit.

In the ECL circuit of FIG. 1, the higher voltage supply $V_{cc}$ is +5 V, and the lower voltage supply $V_{ee}$ is 0 V. The logic "high" level signal of the data inputs D and $\overline{D}$ is usually designed to be about +4.95 V, and the logic "low" level signal of the data inputs D and $\overline{D}$ is usually designed to be about +4.55 V. The threshold value of the base-emitter voltage of the transistors $TR_3'$ and $TR_4'$ is designed lower than the threshold value of the base-emitter voltage of the transistors $TR_1'$ and $TR_2'$. When the set input S and the reset input R are supplied with "low" level signals, the output OUT is determined by the data inputs D and $\overline{D}$. That is, if the data input D is "high" and the data input $\overline{D}$ is "low", the output OUT becomes "high". If the data input D is "low" and the data input $\overline{D}$ is "high", the output OUT becomes "low". When the set input S is "high" and the reset input R is "low", the output OUT becomes "high" even if the data input $\overline{D}$ is "high". When the set input S is "low" and the reset input R is "high", the output OUT becomes "low" even if the data input D is "high".

Figure 2:
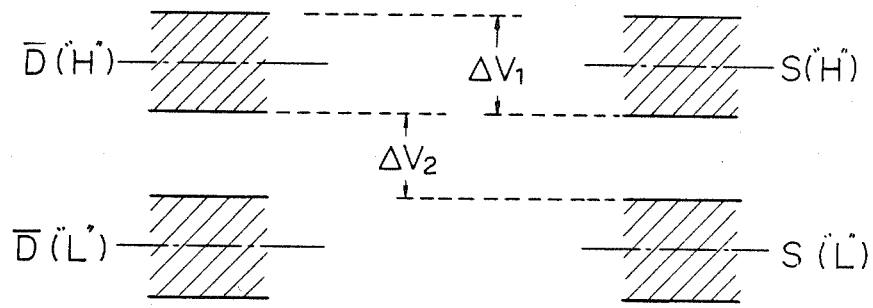
FIG. 2 is a signal level diagram of the variation of the input level of the ECL circuit of FIG. 1.

However, the level of the signals applied to the inputs S, R, D, and $\overline{D}$ varies randomly around the designed value, as shown in FIG. 2. Thus, in the worst case, the "high" level signal applied to the data input $\overline{D}$ may be higher by $\Delta V_1$ than the "high" level signal applied to the set input S. If the value $\Delta V_1$ is larger than the difference between the threshold voltages of the transistors $TR_2'$ and $TR_3'$, the transistor $TR_2'$ is turned on, and the output OUT becomes "low". This means that the set operation of the set transistor $TR_3'$ is not effected. On the other hand, in the worst case, the "high" level signal applied to the data input $\overline{D}$ is higher than the "low" level signal applied to the set input S by only $\Delta V_2$. If the value $\Delta V_2$ is smaller than the difference between the threshold values of the transistors $TR_2'$ and $TR_3'$, the set transistor $TR_3'$ is turned on, and the output OUT becomes "high". Thus, the set operation of the set transistor $TR_3'$ is effected regardless of the set input S being "low".

Figure 3:
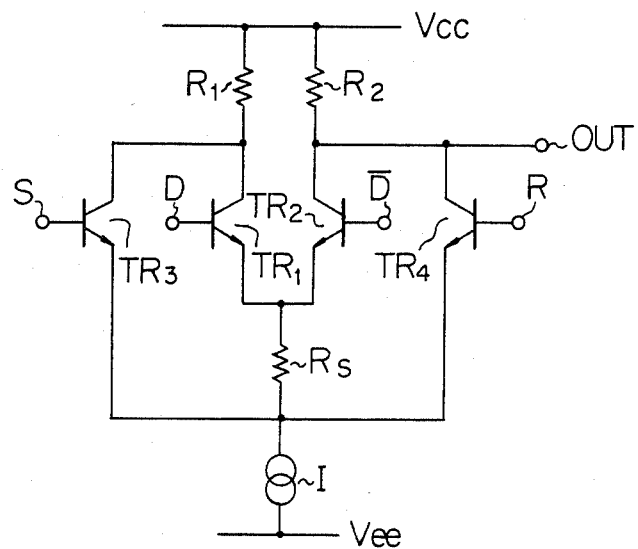
FIG. 3 is a circuit diagram of an ECL circuit in accordance with one embodiment of the present invention.

An ECL circuit in accordance with one embodiment of the present invention is illustrated in FIG. 3. The ECL circuit of FIG. 3 comprises a differential pair of transistors $TR_1$ and $TR_2$, load resistors $R_1$ and $R_2$, a set resistor $R_s$, a constant current source I, a set transistor $TR_3$, and a reset transistor $TR_4$. The emitters of the transistors $TR_1$ and $TR_2$ are commonly connected to a first end of the set resistor $R_s$. The collector of the transistor $TR_1$ is connected to a higher voltage supply $V_{cc}$ through the load resistor $R_1$, and the collector of the transistor $TR_2$ is connected to the voltage supply $V_{cc}$ through the load resistor $R_2$. The constant current source I is connected between a second end of the set resistor $R_s$ and a lower voltage supply $V_{ee}$. The emitters of the set and reset transistors $TR_3$ and $TR_4$ are commonly connected to the second end of the set resistor $R_s$. The collector of the set transistor $TR_3$ is connected to the collector of the transistor $TR_1$, and the collector of the reset transistor $TR_4$ is connected to the collector of the transistor $TR_2$.

In the ECL circuit of FIG. 3, complementary data inputs D and $\overline{D}$ are applied to the bases of the differential pair of transistors $TR_1$ and $TR_2$, respectively. The output OUT of the ECL circuit is led out from the collector of the transistor $TR_2$.

The construction of the ECL circuit of FIG. 3 differs from that of the prior art ECL circuit of FIG. 1 in that the emitters of the set and reset transistors $TR_3$ and $TR_4$ are connected to the emitters of the differential pair of transistors $TR_1$ and $TR_2$ through the set resistor $R_s$. Thus, a voltage difference is produced between the emitters of the differential pair of transistors $TR_1$ and $TR_2$ and the emitters of the set and reset transistors $TR_3$ and $TR_4$. The operation of the set and reset transistors in the ECL circuit of FIG. 3 is the same as that of the prior art ECL circuit of FIG. 1. However, since there is a voltage difference between the emitters of the differential pair of transistors $TR_1$ and $TR_2$ and the emitters of the set and reset transistors $TR_3$ and $TR_4$ as described above, the set transistor $TR_3$ or the reset transistor $TR_4$ can be turned on securely by applying the "high" level signal to the set or reset input S or R, even if the "high" level signal applied to the set and reset inputs S and R has the same level as the "high" level signal applied to the data inputs D and $\overline{D}$.

Assume that a "high" level signal $V_{H1}$ is applied to the base of the transistor $TR_1$ and another "high" level signal $V_{H2}$ is applied to the base of the reset transistor $TR_4$. Then, the base-emitter voltages $V_{BE1}$ and $V_{BE2}$ of the transistors $TR_1$ and $TR_4$ fulfill the following equation (1).

$$V_{H1} + V_{BE1} + I \cdot R_s = V_{H2} \cdot V_{BE2} \quad (1)$$

If $V_{H1} = V_{H2}$, equation (1) can be replaced by the following equation (2).

$$V_{BE1} + I \cdot R_s = V_{BE2} \quad (2)$$

Thus, $V_{BE1} < V_{BE2}$, that is, the base-emitter voltage $V_{BE2}$ of the reset transistor $TR_4$ is higher than the base-emitter voltage $V_{BE1}$ of the transistor $TR_1$. Accordingly, the reset transistor $TR_4$ is turned on, and the output OUT becomes "low". For example, if $R_1 = R_2 = 450\omega$, $R_s = 80\omega$, and $I = 500$ μA, then $I \cdot R_s = 40$ mV. This means that the threshold value of the set or reset transistor becomes lower by 40 mV. Of course, in the ECL circuit of FIG. 3, the threshold value of the set or reset transistor can be formed lower than the threshold value of the differential pair of transistors as described before. In this case, the set or reset operation of the ECL circuit of FIG. 3 can be executed more securely.

As described above, according to the present invention, there can be provided an ECL circuit wherein the output of the ECL circuit can be set or reset securely by just applying a "high" level signal having the same level as the "high" level of the data signal to the set or reset input.

Though the ECL circuit of FIG. 3 comprises both the set and reset transistors, it is, of course, possible for it to comprise only the set transistor or the reset transistor.

Figure 4:
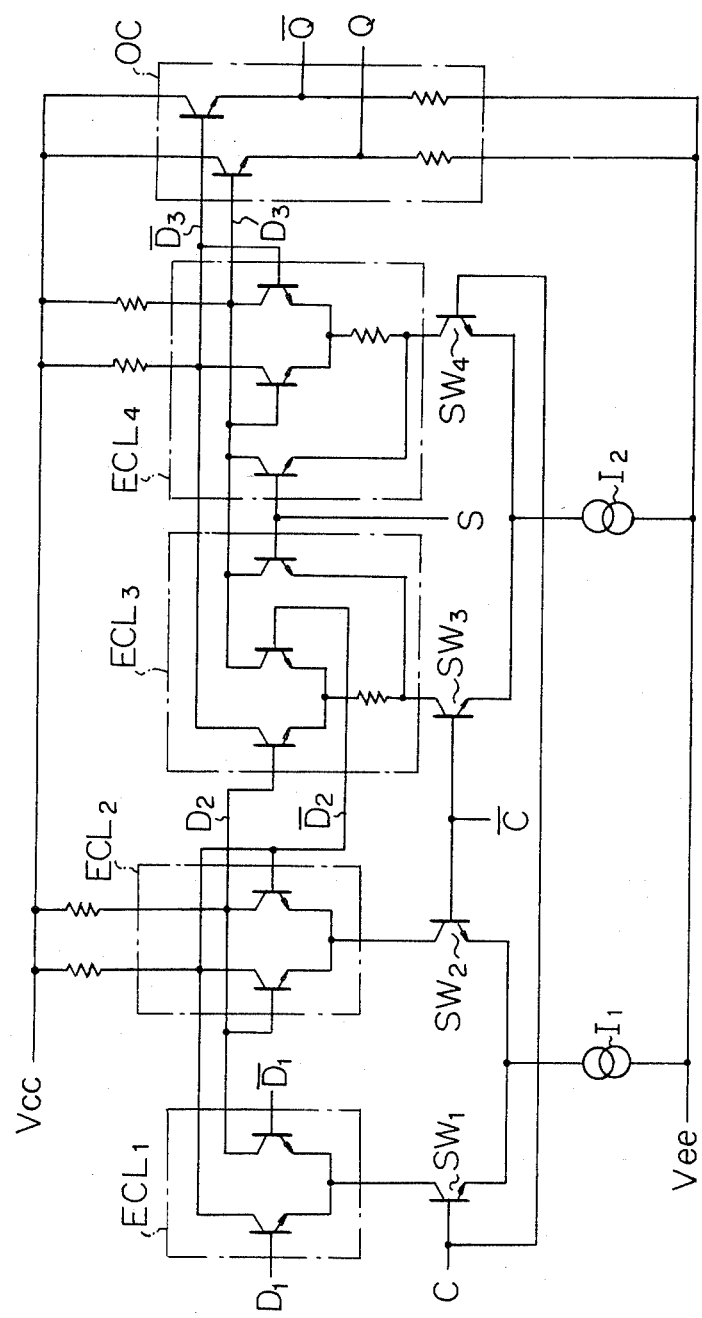
FIG. 4 is a circuit diagram of a flip-flop circuit constructed by using ECL circuits according to the present invention.

A flip-flop circuit constructed by using ECL circuits is illustrated in FIG. 4 as one example of the application of the ECL circuit according to the present invention. The flip-flop circuit of FIG. 4 comprises four ECL circuits $ECL_1$, $ECL_2$, $ECL_3$ and $ECL_4$ and an output circuit OC. The ECL circuits $ECL_1$ and $ECL_2$ do not comprise set transistors. The two ECL circuits $ECL_1$ and $ECL_2$ are connected to a constant current source $I_1$ through switching transistors $SW_1$ and $SW_2$, respectively. The ECL circuits $ECL_3$ and $ECL_4$ comprise set transistors. The two ECL circuits $ECL_3$ and $ECL_4$ are connected to a constant current source $I_2$ through switching transistors $SW_3$ and $SW_4$.

Complementary data input signals $D_1$ and $\overline{D}_1$ are applied to the ECL circuit $ECL_1$. Complementary clock signals C and $\overline{C}$ are applied to the bases of the switching transistors $SW_1$ and $SW_2$, respectively. The clock signals C and $\overline{C}$ are also applied to the bases of the switching transistors $SW_4$ and $SW_3$, respectively. A set input signal S is applied to the bases of the set transistors of the ECL circuits $ECL_3$ and $ECL_4$. When the clock signal C is "high" and the clock signal $\overline{C}$ is "low", the data inputs $D_1$ and $\overline{D}_1$ are read by the ECL circuit $ECL_1$. For example, if the data input $D_1$ is "high", and the data input $\overline{D}_1$ is "low", the data outputs $D_2$ and $\overline{D}_2$ of the ECL circuit $ECL_1$ become "high" and "low" respectively. Then, when the clock signal C becomes "low" and the clock signal $\overline{C}$ becomes "high", the data outputs $D_2$ and $\overline{D}_2$ are latched by the ECL circuit $ECL_2$, and the data $D_2$ and $\overline{D}_2$ are read by the ECL circuit $ECL_3$. In this case, if the set signal S is "low", the data outputs $D_3$ and $\overline{D}_3$ of the ECL circuit $ECL_3$ are determined by the latched data $D_2$ and $\overline{D}_2$. The data outputs $D_3$ and $\overline{D}_3$ are applied to the output circuit OC, and the complementary outputs Q and $\overline{Q}$ of the flip-flop circuit are output in accordance with the data outputs $D_3$ and $\overline{D}_3$. On the other hand, if the set signal S is "high", the data outputs $D_3$ and $\overline{D}_3$ of the ECL circuit $ECL_3$ are fixed to "low" and "high", respectively. Thus, the output Q of the flip-flow circuit is fixed to "low" regardless of the data inputs $D_1$ and $\overline{D}_1$.

In the flip-flop circuit of FIG. 4, the ECL circuit $ECL_3$ and $ECL_4$ are constructed in accordance with the present invention. Therefore, the output of the flip-flop circuit can be set securely by applying a set input signal having the same level as the "high" level signal of the data input to the bases of the set transistors.

We claim:

1. An emitter coupled logic circuit operatively connected to receive complementary signals and a set signal, and having an output terminal, comprising:
   a differential pair of transistors having emitters commonly connected, having bases for receiving the complementary signals, and having collectors;
   an impedance element operatively connected to the commonly connected emitters of said differential pair of transistors;
   a constant current source operatively connected to said impedance element; and
   a set transistor having an emitter operatively connected to said constant current source, having a base for receiving the set signal and having a collector operatively connected to the collector of one of said differential pair of transistors, the output terminal being operatively connected to the collector of one of the transistors forming said differential pair of transistors, for providing an output from said differential pair of transistors.

2. An emitter coupled logic circuit as defined in claim 1, wherein said differential pair of transistors have a first threshold voltage level, wherein said set transistor has a second threshold voltage level, and wherein the second threshold voltage level of said set transistor is made smaller than the first threshold voltage level of said differential pair of transistors.

3. An emitter coupled logic circuit as defined in claim 1, wherein the collector of said set transistor is an output terminal of said emitter coupled logic circuit.

4. An emitter coupled logic circuit operatively connected to receive a first input signal, a second input signal which is a complement of the first input signal and a set signal, and having an output terminal, comprising:
   a first differential transistor having a base operatively connected to receive the first input signal, having an emitter and having a collector;
   a second differential transistor having a base operatively connected to receive the second input signal, having an emitter operatively connected to the emitter of said first differential transistor at a node, and having a collector operatively connected to the output terminal for providing an output from said second differential transistor;
   a set transistor having a base operatively connected to receive the set signal, having a collector operatively connected to the collector of said first differential transistor, and having an emitter;
   a set resistor having a first terminal operatively connected to said node and having a second terminal operatively connected to the emitter of said set transistor; and
   a constant current source operatively connected to said second terminal of said set resistor.

5. An emitter coupled logic circuit, operatively connectable to receive a reset signal, as defined in claim 4, further comprising a reset transistor having a base operatively connected to receive the reset signal, having an emitter operatively connected to said second terminal of said set resistor and having a collector operatively connected to the collector of said second differential transistor, wherein said collector of said reset transistor functions as an output terminal of the emitter coupled logic circuit.

* * * * *